United States Patent [19]

Nakata et al.

[11] Patent Number: 5,169,340
[45] Date of Patent: Dec. 8, 1992

[54] ELECTRICAL CONNECTOR

[75] Inventors: Naohisa Nakata; Kensaku Sato, both of Tokyo, Japan

[73] Assignee: Hirose Electric Co., Ltd., Tokyo, Japan

[21] Appl. No.: 796,647

[22] Filed: Nov. 22, 1991

[30] Foreign Application Priority Data

Dec. 6, 1990 [JP] Japan ............................ 2-401476[U]

[51] Int. Cl.$^5$ .......................................... H01R 13/648
[52] U.S. Cl. ..................................... 439/607; 439/609
[58] Field of Search ................... 439/95, 108, 607–610

[56] References Cited

U.S. PATENT DOCUMENTS 5,035,652  7/1991  Shibano ................................ 439/610
5,041,022  8/1991  Sekiguchi ............................. 439/609

Primary Examiner—Gary F. Paumen
Attorney, Agent, or Firm—Kanesaka & Takeuchi

[57] ABSTRACT

An electrical connector includes a connector housing (3) having a mounting portion (8a) to be mounted on a metallic panel (65), and outer and inner tubular portions (6, 7) extending forwardly from the bottom face to form a connector fitting recess (12) between them; a lock recess (13) formed on the outer tubular portion for engagement with a lock arm (45) of a mating connector (2); a contact terminal assembly (4) inserted into the inner tubular portion and having a shield jacket (24) around the contact terminal assembly, the contact terminal assembly comprising an insulation body pressed-fit in the shield jacket and an electrical contact element (26) supported by the insulation body; and a rear cover (52) mounted on the rear portion of the connector housing to cover the contact terminal assembly thereby improving the shield effects.

1 Claim, 17 Drawing Sheets

ELECTRICAL CONNECTOR

BACKGROUND OF THE INVENTION

1. Field of the Invention

The present invention relates to right angle DIP connectors for shielded cables which are used for electronic equipment or the like.

2. Description of the Prior Art

In FIG. 40, a conventional electrical connector of this type or connector socket (a) of the electrical connector includes a metallic jacket (b) in which contacts are mounted via an insulating body. This connector socket is attached to a panel (c) by fastening the flange (d) to the panel with screws (e). To lock a connector plug to this connector socket, the connector plug is threaded over the connector socket.

In the above connector, however, it is impossible to connect and disconnect the connector plug from the connector socket with a single touch because it is necessary to thread the connector plug over the connector socket.

SUMMARY OF THE INVENTION

Accordingly, it is an object of the invention to provide an electrical connector socket which is easy to connect and disconnect a connector plug with a single touch.

It is another object of the invention to provide an electrical connector socket which is durable against forcible plugging in and out of the connector socket of a connector plug.

It is still another object of the invention to provide an electrical socket which is connected firmly to a connector plug and is resistant against vibrations, thus suitable for use in automobile electronic equipment.

It is yet another object of the invention to provide an electrical socket which has excellent shield effects.

According to the invention there is provided an electrical connector which includes a connector housing having a bottom face to be mounted on a printed circuit board, and inner and outer tubular portions extending forwardly from a rear face of the socket housing to form a connector fitting recess between them; a lock recess formed on the outer tubular portion for engagement with a lock arm of a mating connector; a contact terminal assembly inserted into the inner tubular portion and having a shield jacket; the contact terminal assembly comprising an insulation body and an electrical contact element supported by the insulation body; and a rear electrically conductive cover mounted on the rear face of the connector housing to cover the contact terminal assembly thereby improving shield effects.

With the connector according to the invention it is possible to connect and disconnect the mating connector from the connector with a single touch because the fitting portion of the connector is fitted into the fitting recess of the connector to bring the contact terminal of the connector into contact with the contact portion of the connector while the lock arm of the connector is engaged with the lock recess of the connector for locking. The strength against the forcible plugging in and out of the connector of the connector is increased because the contact terminal is placed within the connector housing which is secured to a printed circuit board when the contact terminal is mounted on the PCB. Since the lock recess which engages the lock arm of the connector is formed on the housing, the connection between the connectors is very strong and resistant against vibrations and suitable for automotive electronic equipment. In addition, the rear cover covers the contact terminal within the connector housing thereby improving the shield effects.

The above and other objects, features, and advantages of the invention will be more apparent from the following description when taken in conjunction with the accompanying drawings.

DESCRIPTION OF THE PREFERRED EMBODIMENT

Figure 1:
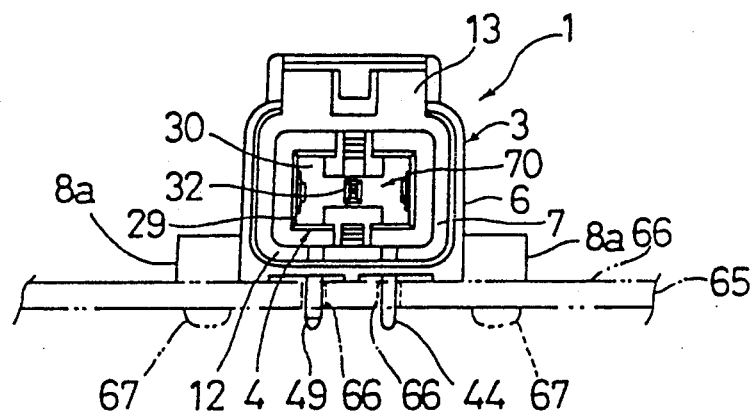
FIG. 1 is a front view of a connector socket according to an embodiment of the invention.
Figure 39:
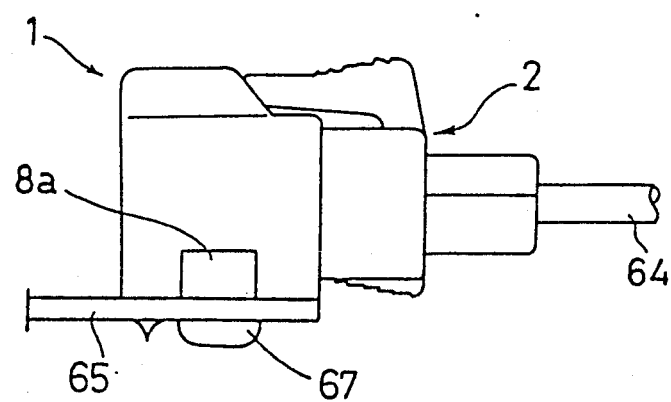
FIG. 39 is a side view showing the connection of the connector plug into the connector socket which is mounted on a printed circuit board.
Figure 2:
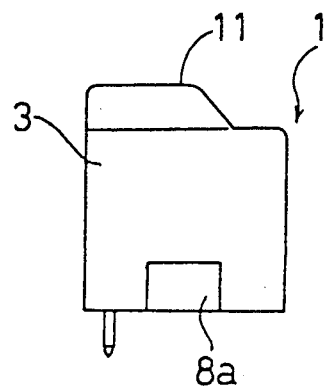
FIG. 2 is a side view of the connector socket.
Figure 3:
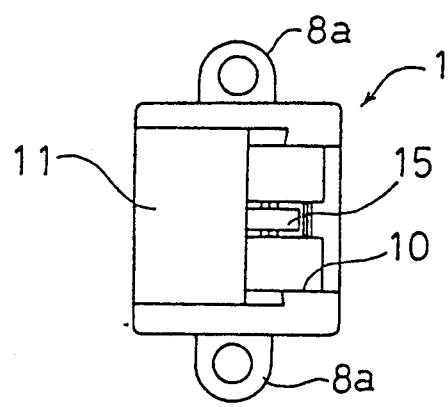
FIG. 3 is a top view of the connector socket.
Figure 4:
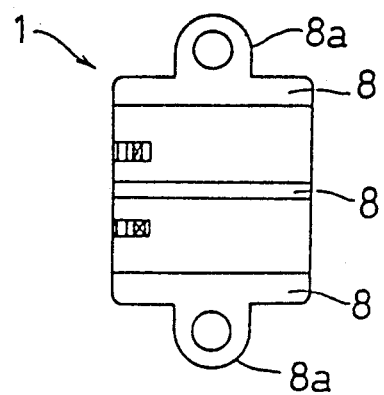
FIG. 4 is a bottom view of the connector socket.
Figure 5:
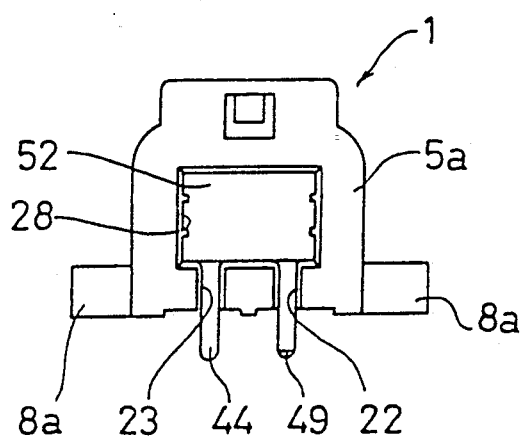
FIG. 5 is a rear view of the connector socket.
Figure 6:
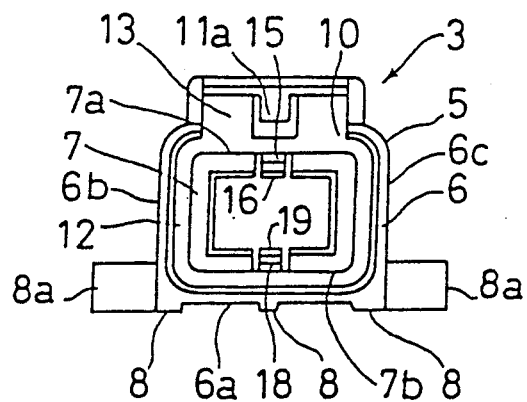
FIG. 6 is a front view of a socket housing useful for the connector socket.
Figure 7:
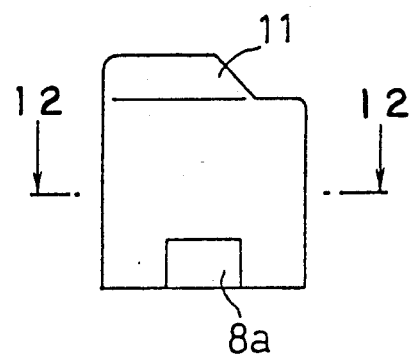
FIG. 7 is a side view of the socket housing.
Figure 8:
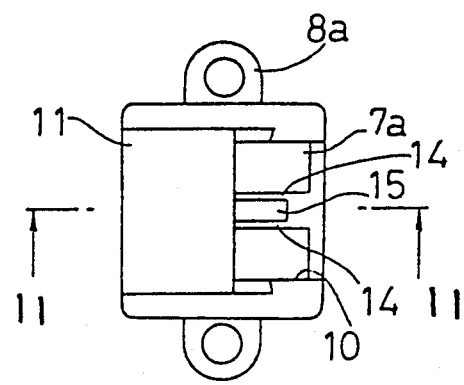
FIG. 8 is a top view of the socket housing.
Figure 9:
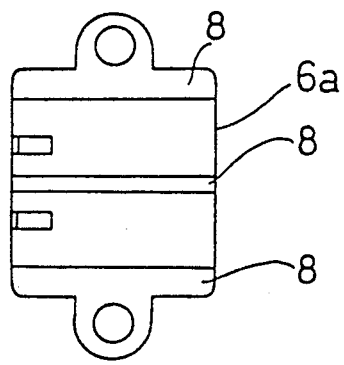
FIG. 9 is a bottom view of the socket housing.
Figure 10:
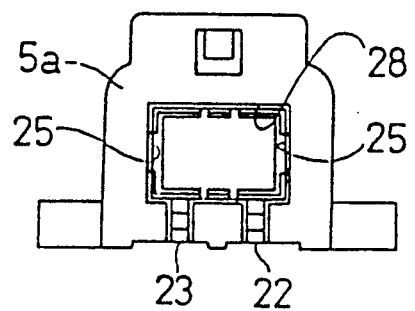
FIG. 10 is a rear view of the socket housing.
Figure 11:
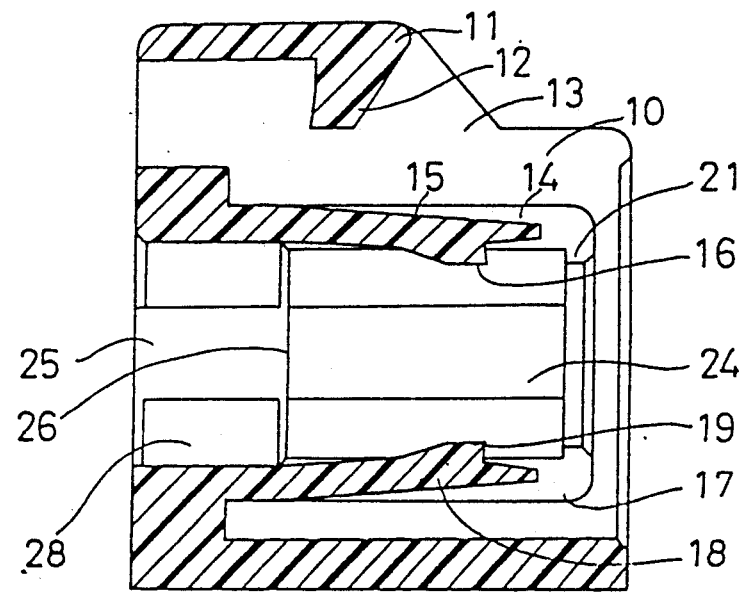
FIG. 11 is a sectional view taken along line 11—11 of FIG. 8.
Figure 12:
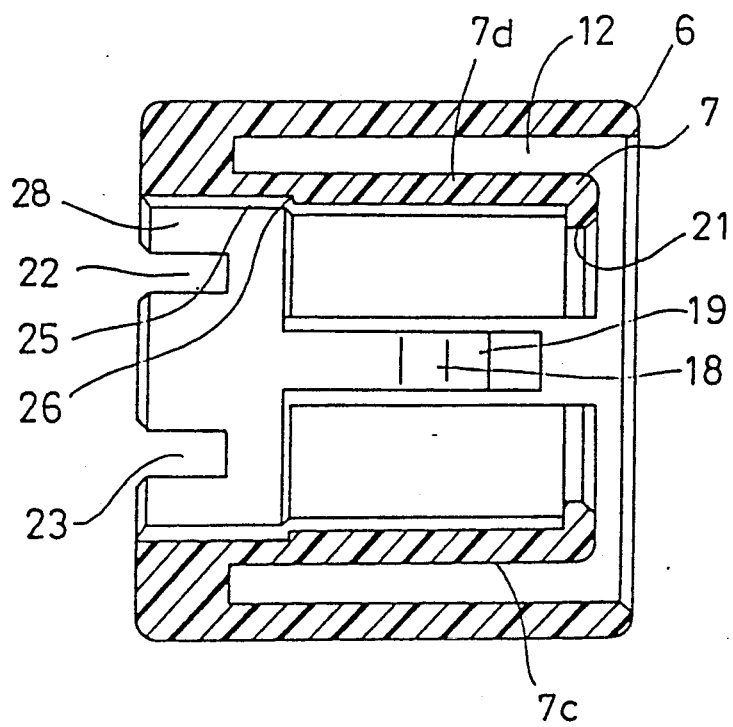
FIG. 12 is a sectional view taken along line 12—12 of FIG. 7.
Figure 13:
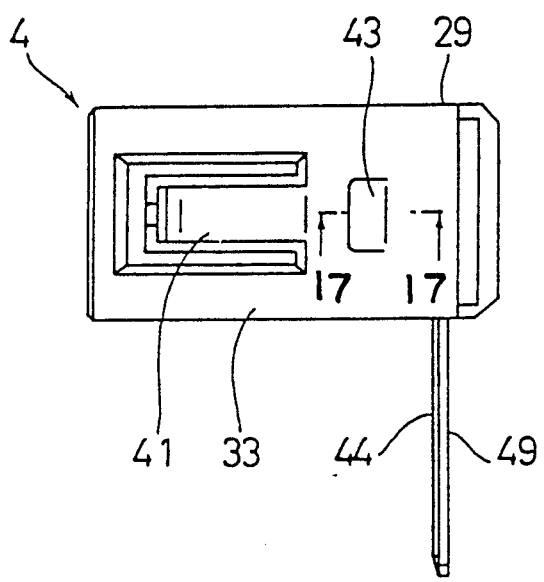
FIG. 13 is a side view of a contact terminal assembly useful for the connector socket.
Figure 14:
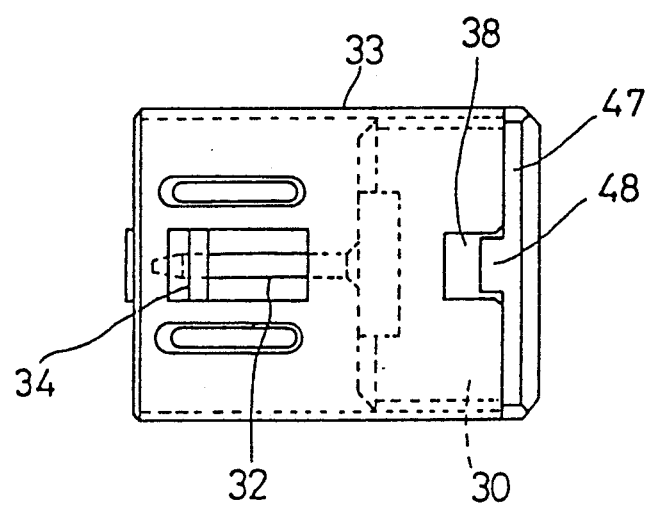
FIG. 14 is a top view of the contact terminal assembly.
Figure 15:
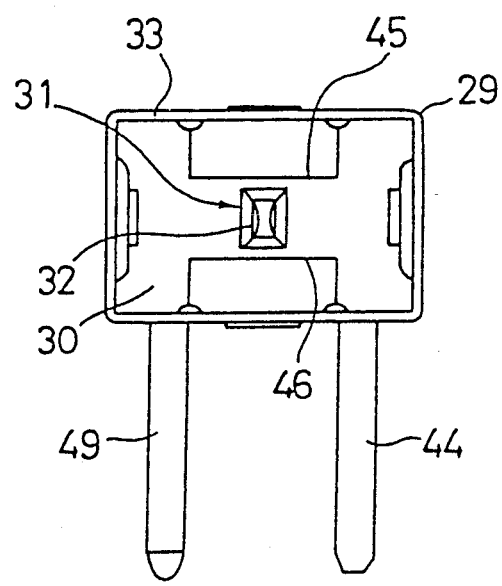
FIG. 15 is a front view of the contact terminal assembly.
Figure 16:
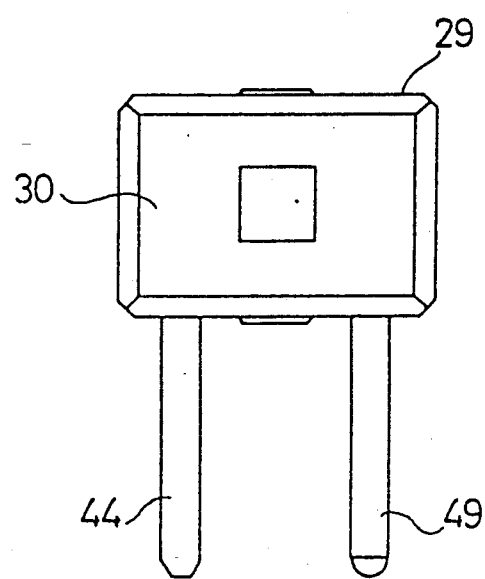
FIG. 16 is a rear view of the contact terminal assembly.
Figure 17:
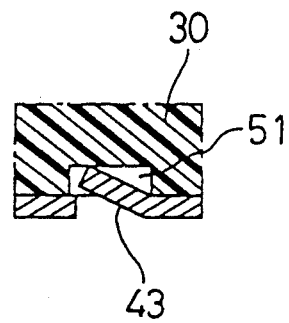
FIG. 17 is a sectional view taken along line 17—17 of FIG. 13.
Figure 18:
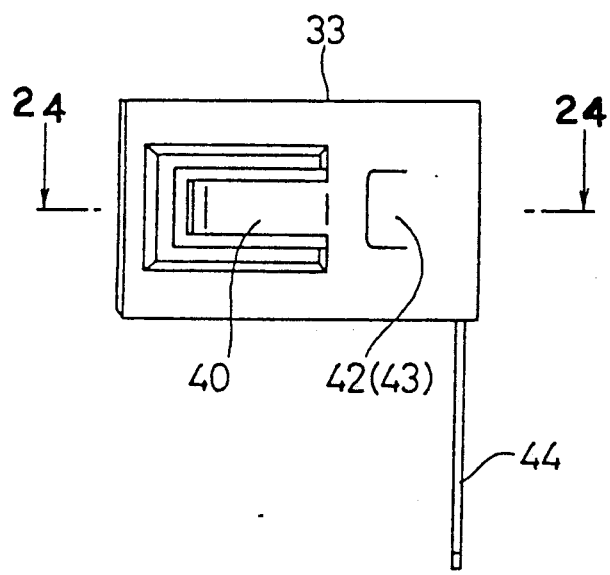
FIG. 18 is a side view of a shield jacket useful for the connector socket.
Figure 19:
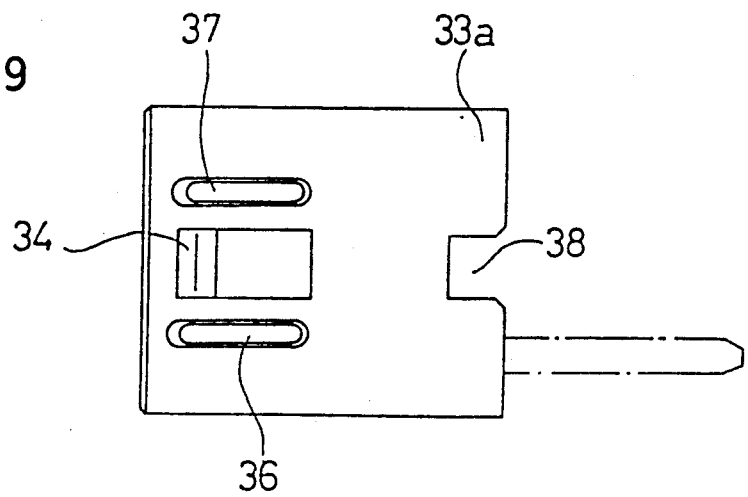
FIG. 19 is a top view of the shield jacket.
Figure 20:
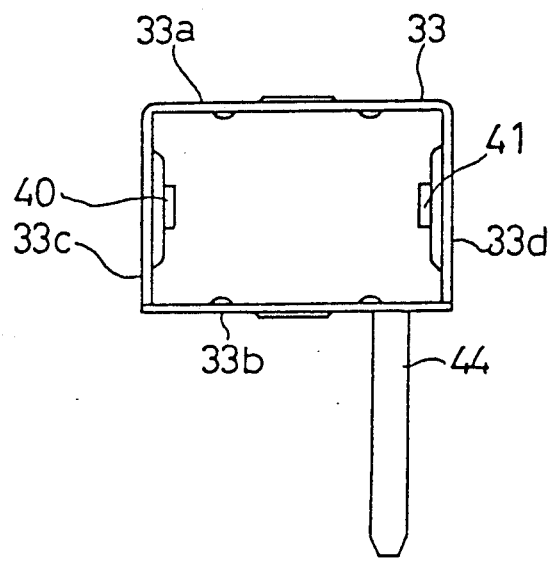
FIG. 20 is a front view of the shield jacket.
Figure 21:
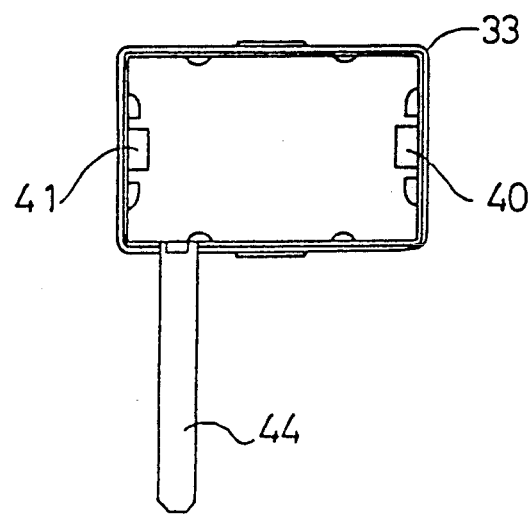
FIG. 21 is a rear view of the shield jacket.
Figure 22:
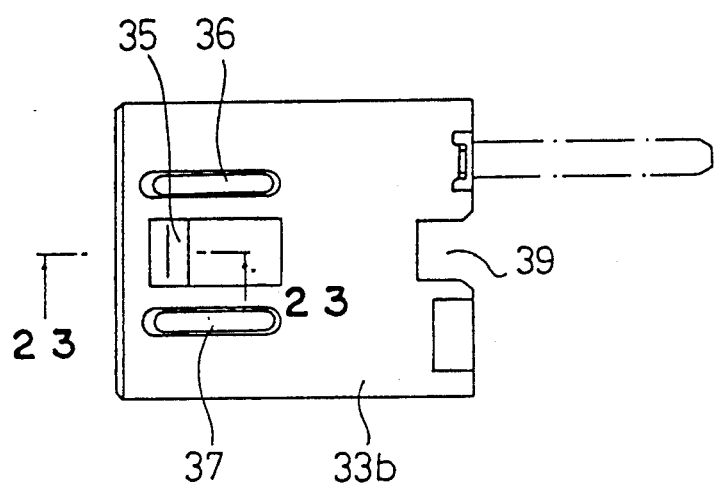
FIG. 22 is a bottom view of the shield jacket.
Figure 23:
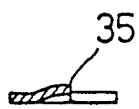
FIG. 23 is a sectional view taken along line 23—23 of FIG. 22.
Figure 24:
FIG. 24 is a sectional view taken along line 24—24 of FIG. 18.
Figure 25:
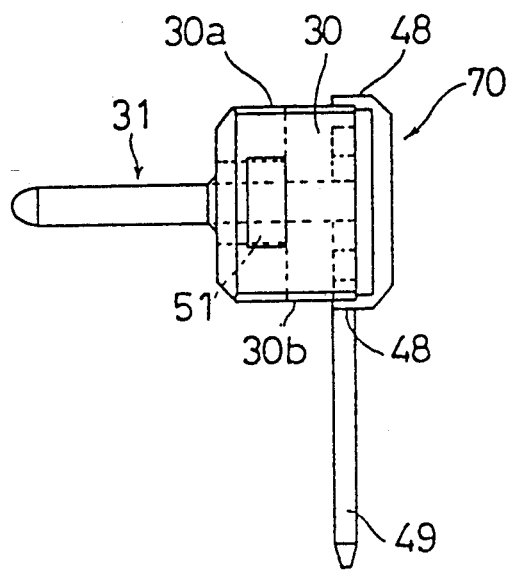
FIG. 25 is a side view of an insulation assembly useful for the connector socket.
Figure 26:
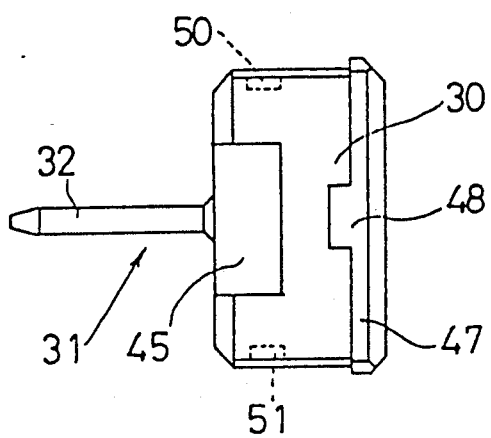
FIG. 26 is a top view of the insulation assembly.
Figure 27:
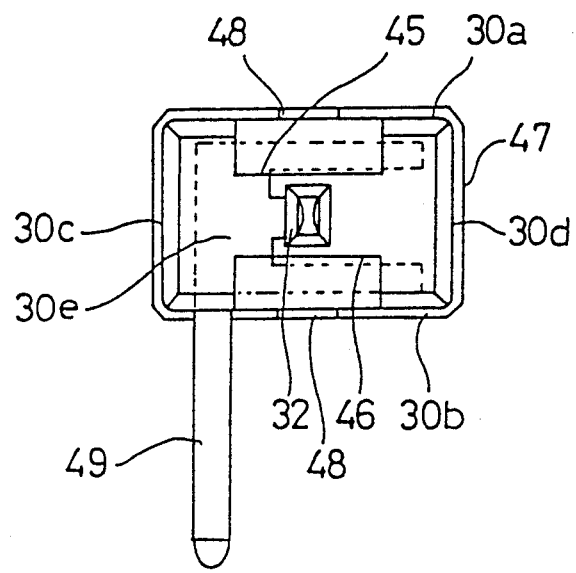
FIG. 27 is a front view of the insulation assembly.
Figure 28:
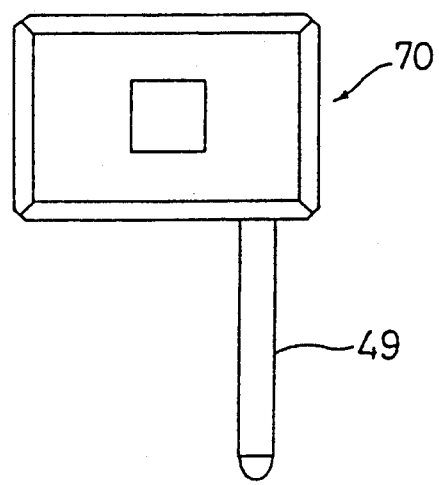
FIG. 28 is a rear view of the insulation assembly.

In FIG. 39, a right angle DIP connector for a shielded cable 64 consists of a connector socket 1 and a connector plug 2.

In FIGS. 1-5, the connector socket 1 includes a socket housing 3, an electrical contact terminal assembly 4 fitted in the socket housing 3, and a rear electrically conductive cover 52 mounted on the rear face of the socket housing 3.

In FIGS. 6-12, the socket housing 3 has a socket body 5 which is molded from a synthetic resin so as to have a rectangular outer tubular portion 6 and a rectangular inner tubular portion 7 both extending forwardly from the rear face thereof. Mounting faces 8 are formed at the center and on opposite edges of the bottom face 6a. A pair of mounting legs 8a extend laterally from the bottom face 6a on opposite side faces 6b and 6c of the outer tubular portion 6. A cutout 10 extend rearwardly from the upper front edge of the outer tubular portion 6. A cover 11 extends forwardly from the rear face 5a of the socket body 5 so as to cover the mid-to-rear portion of the cutout 10. A lock projection 11a is formed on the inside of the cover 11.

The inner tubular portion 7 is made rectangular forming a plug receiving recess 12 between the outer and inner tubular portions 6 and 7. A lock recess 13 is formed between a top face 7a of the inner tubular portion 7 and the cover portion 11. A slot 14 extends rearwardly from the front edge of the upper wall 7a of the inner tubular portion 7. A tongue member 15 extends forwardly from the rear end of the slot 14 and has an engaging projection 16 on the lower front portion. Similarly, a slot 17 extends rearwardly from the front edge of the lower wall 7b. A tongue member 18 extends forwardly from the rear end of the slot 17 and has an engaging projection 19 on the upper front portion. The inner tubular portion 7 has a cover mounting portion 28 around an opening at the rear edge and a stopper 21 raised inwardly from the inside faces 7a, 7b, 7c, and 7d along the front edge. A pair of terminal receiving recesses 22 and 23 are formed on the rear end of the cover mounting portion 28. A pair of press-fit channels 24 and 25 are formed on the inside faces 7c and 7d of the inner tubular portion 7 and the inside faces of the cover mounting portion 28, respectively. The press-fit channels 25 are stepped down from the press-fit channels 24 at 26.

In FIGS. 13-16, the electrical contact terminal assembly 4 includes an shield jacket 29, an insulation body 30, and a contact element 31.

In FIGS. 18-22, the shield jacket 29 has a jacket body 33 stamped and formed from sheet metal. A pair of engaging tongues 34 and 35 extend rearwardly from the front portions of upper and lower faces 33a and 33b. A pair of elongated indentations 36 and 37 are formed on the upper and lower faces 33a and 33b on opposite sides of each engaging piece 34 or 35. A pair of rectangular cutouts 38 and 39 are formed on the rear edges of the upper and lower faces 33a and 33b. A pair of engaging arms 40 and 41 extend forwardly from the middle portions of side faces 33c and 33d. A pair of rectangular engaging ears 42 and 43 extend forwardly and inwardly from the rear portions of opposite sides 33c and 33d. A shield terminal 44 extend downwardly from the rear edge of the lower face 33b.

In FIGS. 25-28, the insulation assembly 70 consists of an insulation body 30 and a contact element 31 insert molded in the insulation body 30. The insulation body 30 is of a rectangular block having four faces 30a, 30b, 30c, and 30d. A stopper portion 47 is raised along the rear edge of the insulation body 30. A pair of positioning projections 48 and a pair of recesses 45 and 46 are formed on the rear and front central portions of the upper and lower faces 30a and 30b. A pair of engaging recesses 50 and 51 are formed on opposite side faces 30c and 30d.

Figure 29:
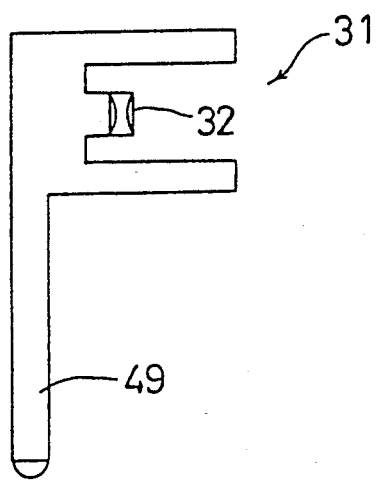
FIG. 29 is a front view of a contact element useful for the connector socket.
Figure 30:
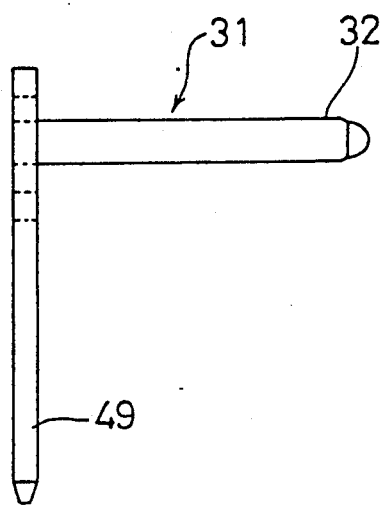
FIG. 30 is a side view of the contact element.
Figure 31:
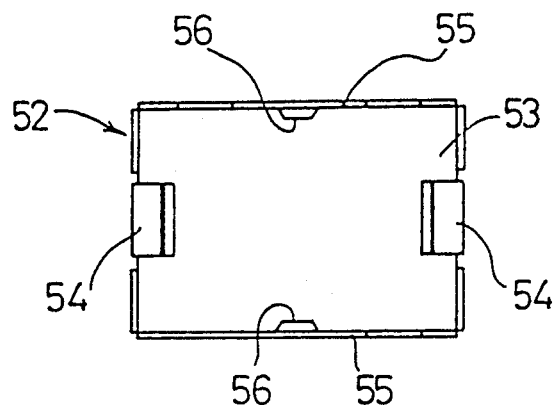
FIG. 31 is a front view of a rear cover useful for the connector socket.
Figure 32:
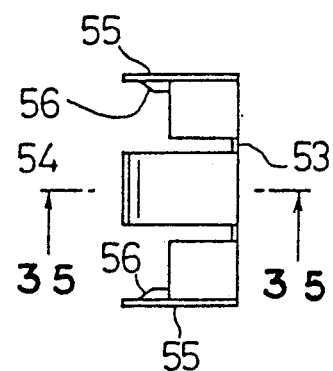
FIG. 32 is a side view of the rear cover.
Figure 33:
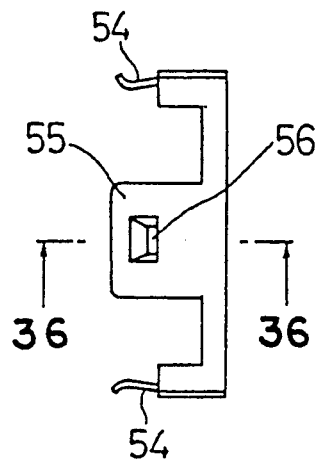
FIG. 33 is a top view of the rear cover.
Figure 34:
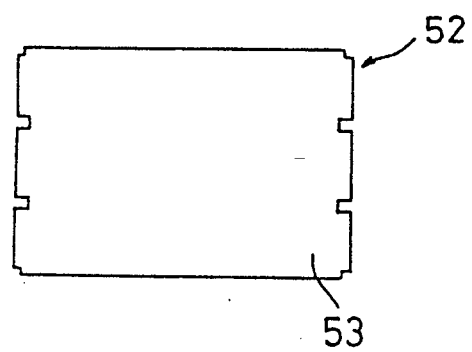
FIG. 34 is a rear view of the rear cover.
Figure 35:
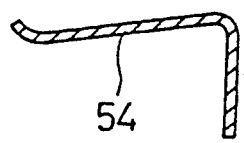
FIG. 35 is a sectional view taken along line 35—35 of FIG. 32.
Figure 36:
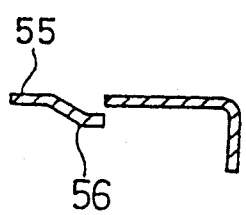
FIG. 36 is a sectional view taken along line 36—36 of FIG. 33.

In FIGS. 29 and 30, the contact element 31 has a contact portion 32 and a leg portion 49 extending downwardly from the contact portion 32. The contact element 31 is embedded in the insulating body 30 such that the contact portion 36 is positioned in the center of a front face 35e of the insulating body 30 while the leg portion 49 extends downwardly from the bottom face 30b of the insulation block 30.

The insulation assembly 70 is press-fitted into the shield jacket 29 to provide the contact terminal assembly 4. The insulation assembly 70 is fitted into the shield jacket 29 from the back such that the positioning projections 48 are inserted into the cutouts 38 and 39 of the shield jacket 29, the engaging ears 42 and 43 engage the recesses 50 and 51 of the insulation assembly 70 while the stopper portion 47 abuts on the rear edge of the shield jacket 29. The contact portion 32 is positioned in the center of the shield jacket 29 while the leg portion 49 is positioned in parallel to the shield terminal 44.

In FIGS. 31-35, the rear cover 52 is stamped and formed from sheet metal so as to have a rectangular face 53 with a pair of gripping arms 54 and a pair of upper and lower engaging sides 55. The engaging sides 55 have an engaging indentation 56.

The contact terminal assembly 4 is inserted into the inner tubular portion 7 of the socket housing 6 from the back and the rear cover 52 is mounted on the cover mounting portion 28 to provide the complete connector socket 1. Thus, the front edge of the shield jacket 29 abuts on the stopper portion 21 of the inner tubular portion 7, the engaging projections 16 and 19 of the tongue members 15 and 18 engage the engaging recesses 34 and 35 of the shield jacket 29, and the terminal leg 49 and the shield terminal 44 are inserted in the cutouts 22 and 23 of the socket housing 6. The gripping arms 54 of the rear cover 52 are inserted into the cover mounting portion 28 to grip the shield jacket 29 on the sides. The engaging lugs 55 of the rear cover 52 are inserted into the cover mounting portion 28 so that the engaging projections 56 engage the cutouts 38 and 39 of the shield jacket 29.

Figure 37:
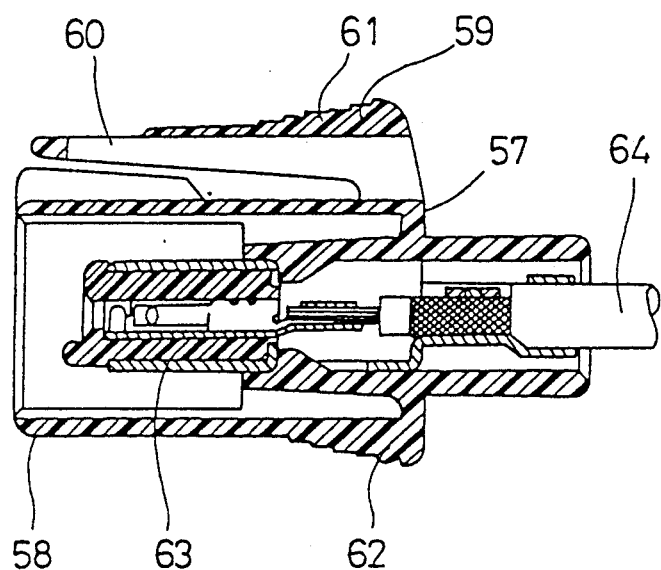
FIG. 37 is a longitudinal section of a connector plug.
Figure 38:
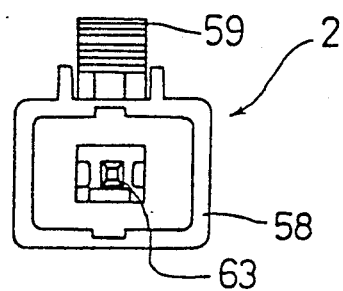
FIG. 38 is a front view of the connector plug.
Figure 40:
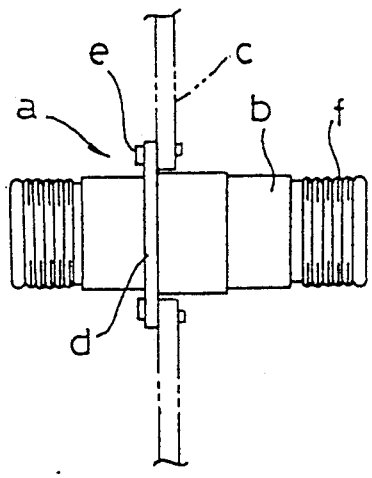
FIG. 40 is a side view of a conventional electrical connector.

In FIGS. 37 and 38, the connector plug 2 includes a plug body 57 which has a rectangular front fitting portion 58. A lock arm 59 extend forwardly from the rear portion of the upper face of the plug body 57 and has a lock opening 60 on the front portion. The upper and lower rear faces 61 and 62 of the lock arm 59 and the plug body 57 are corrugated for preventing slippage. A terminal 63 is provided within the plug body 57 and connected to a shielded cable 64.

How to connect the connector plug 2 to the connector socket 1 will be described.

The mounting face 8 of the connector socket 1 is brought into contact with the mounting face 66 of a printed circuit board 65. The terminal leg 49 and the shield terminal 44 are inserted through the through-holes 66 of the PCB 65 and soldered to the conductors. The mounting legs 8a of the socket housing 3 are secured to the PCB 65 with screws 67 to mount the connector socket 1 on the PCB 65.

The fitting portion 58 of the connector plug 2 is fitted into the plug recess 12 of the connector socket 1 to bring the terminal 63 into contact with the contact portion 32 while the lock arm 59 of the connector plug 2 is fitted into the lock recess 13 of the connector socket 1 such that the lock projection 11a engages the lock opening 60, thereby locking the connector plug 2 to the connector socket 1.

In the above connector, the fitting portion 44 of the connector plug 2 is fitted into the fitting recess 12 of the connector socket 1 to bring the terminal 48 into contact with the contact portion 32 of the connector socket 1 while the lock arm 59 of the connector plug 2 is fitted into the lock recess 13 of the connector socket 1 for locking, thus making possible the connection and disconnection between the connector socket 1 and the connector plug 2 with a single touch. The strength against the forcible plugging in and out of the connector of socket 1 of the connector plug 2 is increased because the contact terminal assembly 4 is housed in the socket housing 3, and the socket housing 3 is secured to the printed circuit board 65 when the contact terminal 70 is mounted on the PCB 65. The lock recess 13 of the socket housing 3 into which the lock arm 59 of the connector plug 2 is fitted makes the connection of the connector plug 2 to the connector socket 1 so strong and so resistant to vibrations that the connector is suitable for use in automotive electronic equipment. In addition, the rear cover 52 cover the contact terminal 70 within the socket housing 3, thus improving the shield effects.

As has been described above, the fitting portion of a connector plug is fitted into the fitting recess of a connector socket so that the contact element of the connector plug is brought into contact with the contact portion of the connector socket while the lock arm of the connector plug is fitted in the lock recess of the connector socket for making a lock, thereby making it possible to connect and disconnect the connector plug from the connector socket with a single touch. Since the contact terminal assembly is placed within the socket housing, the socket housing is secured to a printed circuit board to attach the contact terminal assembly to the printed circuit board so that the strength against forcible plugging in and out of the connector plug from the connector socket is increased. Since the lock recess into which the lock arm of the connector plug is fitted for engagement is formed on the socket housing, the connection between the connector plug and socket is sufficiently strong to withstand vibrations and thus suitable for use in automobile electronic equipment. In addition, the rear cover covers the contact terminal within the socket housing thereby not only improving the shield effects but also making it possible to ground the shield to the printed circuit board 65.

We claim:

1. An electrical connector comprising:
   a connector housing having a mounting face, and inner and outer tubular portions extending forwardly from said mounting face to form a connector fitting recess between them;
   a lock recess formed on said outer tubular portion for engagement with a lock arm of a mating connector;
   a cover mounting portion formed on a rear end of said inner tubular portion;
   a contact terminal assembly inserted into said inner tubular portion and having an electrically conductive shield jacket around said contact terminal assembly, said contact terminal assembly comprising:
   an insulation body press-fitted in said shield jacket and an electrical contact element supported by said insulation body; and
   a rear cover mounted on said cover mounting portion of said connector housing.

* * * * *